United States Patent
Wei et al.

(10) Patent No.: US 9,337,312 B2
(45) Date of Patent: May 10, 2016

(54) METHOD FOR SYSTEM FOR MANUFACTURING TFT, TFT, AND ARRAY SUBSTRATE

(71) Applicants: BOE TECHNOLOGY GROUP CO., LTD., Beijing (CN); CHENGDU BOE OPTOELECTRONICS TECHNOLOGY CO., LTD., Chengdu (CN)

(72) Inventors: Xiaodan Wei, Beijing (CN); Xiaofeng Yang, Beijing (CN); Dongkoog Jang, Beijing (CN); Shuibin Ni, Beijing (CN)

(73) Assignees: BOE TECHNOLOGY GROUP CO., LTD. (CN); CHENGDU BOE OPTOELECTRONICS TECHNOLOGY CO., LTD. (CN)

( * ) Notice: Subject to any disclaimer, the term of this patent is extended or adjusted under 35 U.S.C. 154(b) by 0 days.

(21) Appl. No.: 14/382,928

(22) PCT Filed: Dec. 17, 2013

(86) PCT No.: PCT/CN2013/089617
§ 371 (c)(1),
(2) Date: Sep. 4, 2014

(87) PCT Pub. No.: WO2015/007055
PCT Pub. Date: Jan. 22, 2015

(65) Prior Publication Data
US 2015/0228760 A1    Aug. 13, 2015

(30) Foreign Application Priority Data

Jul. 19, 2013    (CN) .......................... 2013 1 0306171

(51) Int. Cl.
*H01L 21/00*        (2006.01)
*H01L 29/66*        (2006.01)
(Continued)

(52) U.S. Cl.
CPC ........ *H01L 29/66742* (2013.01); *H01L 21/283* (2013.01); *H01L 21/3081* (2013.01);
(Continued)

(58) Field of Classification Search
CPC ............ H01L 29/66742; H01L 29/786; H01L 21/32133; H01L 21/32139; H01L 21/30604; H01L 21/3081; H01L 21/3086; H01L 21/67161; H01L 21/67207; H01L 21/6723; H01L 21/67069; H01L 21/67075; H01L 21/67109
USPC ............................................ 438/149; 257/57
See application file for complete search history.

(56) References Cited

U.S. PATENT DOCUMENTS

| | | | |
|---|---|---|---|
| 2007/0082435 A1 | 4/2007 | Lai et al. | |
| 2008/0003726 A1 | 1/2008 | Park | |
| 2011/0068341 A1* | 3/2011 | Li | H01L 27/12 257/59 |

FOREIGN PATENT DOCUMENTS

| | | |
|---|---|---|
| CN | 101034262 | 9/2007 |
| CN | 101246285 | 8/2008 |

(Continued)

OTHER PUBLICATIONS

Text of the Notification of the First Office Action issued in corresponding Chinese Application No. 2013103061712 dated Apr. 29, 2015.

(Continued)

*Primary Examiner* — Dung Le
(74) *Attorney, Agent, or Firm* — Baker Hostetler LLC (57) ABSTRACT

The method for manufacturing the TFT includes: forming a semiconductor film, a doped semiconductor film, a source/drain electrode film, and a first patterned photoresist layer sequentially; performing first etching to remove the source/drain electrode film on a region that is not covered by the first patterned photoresist layer; performing second etching to remove the doped semiconductor film and the semiconductor film on a region that is not covered by the first patterned photoresist layer; performing ashing treatment on the photoresist layer to remove the photoresist layer on the channel region; hard-baking the photoresist layer after the ashing treatment; performing third etching to remove the source/drain electrode film on a region that is not covered by the photoresist layer; and performing fourth etching to remove the doped semiconductor film on the region that is not covered by the photoresist layer.

10 Claims, 6 Drawing Sheets

(51) Int. Cl.
| | | |
|---|---|---|
| H01L 27/12 | (2006.01) | |
| H01L 21/283 | (2006.01) | |
| H01L 21/306 | (2006.01) | |
| H01L 21/308 | (2006.01) | |
| H01L 21/3213 | (2006.01) | |
| H01L 21/67 | (2006.01) | |
| H01L 21/677 | (2006.01) | |
| H01L 29/786 | (2006.01) | |

(52) U.S. Cl.
CPC ...... *H01L21/3086* (2013.01); *H01L 21/30604* (2013.01); *H01L 21/32133* (2013.01); *H01L 21/32139* (2013.01); *H01L 21/6723* (2013.01); *H01L 21/67069* (2013.01); *H01L 21/67075* (2013.01); *H01L 21/67109* (2013.01); *H01L 21/67161* (2013.01); *H01L 21/67207* (2013.01); *H01L 21/67742* (2013.01); *H01L 27/1288* (2013.01); *H01L 29/786* (2013.01)

(56) References Cited

FOREIGN PATENT DOCUMENTS

| CN | 101393388 | 3/2009 |
|---|---|---|
| CN | 102148259 | 8/2011 |
| CN | 103367166 | 10/2013 |

OTHER PUBLICATIONS

International Search Report and Written Opinion issued in corresponding International Application No. PCT/CN2013/089348 dated Apr. 23, 2014.

\* cited by examiner

METHOD FOR SYSTEM FOR MANUFACTURING TFT, TFT, AND ARRAY SUBSTRATE

CROSS-REFERENCE TO RELATED APPLICATION

This application is the U.S. national phase of PCT Application No. PCT/CN2013/089617 filed on Dec. 17, 2013, which claims priority to Chinese Patent Application No. 201310306171.2 filed on Jul. 19, 2013, the disclosures of which are incorporated in their entirety by reference herein.

TECHNICAL FIELD

The present invention relates to the field of display technology, in particular to a method and a system for manufacturing a thin film transistor (hereinafter "TFT"), the TFT and an array substrate.

BACKGROUND

A method for manufacturing a TFT in the prior art includes a step of forming a pattern of source/drain electrode by a patterning process. To be specific, after a photoresist is coated on the TFT provided with a gate electrode, the photoresist is subjected to an exposure treatment so as to form a pattern identical to the pattern of source/drain electrode, and then subjected to etching by means of an etching method including one etching step and one dry etching step so as to form the pattern of source/drain electrode, a pattern of semiconductor layer, a pattern of doped semiconductor layer, and a channel region. The etching method includes: wet etching a source/drain metal layer using a diluted etchant, so as to form the pattern of source/drain electrode and the channel region; and dry etching the pattern of semiconductor layer and the pattern of doped semiconductor layer, so as to form the pattern of semiconductor layer and the pattern of doped semiconductor layer identical to the pattern of source/drain electrode.

However, the etching method including one wet etching step and one dry etching step causes an undercut between the pattern of semiconductor layer and the pattern of doped semiconductor layer.

SUMMARY

An object of the present invention is to provide a method and a system for manufacturing a TFT, so as to prevent an undercut between a pattern of semiconductor layer and a pattern of doped semiconductor layer when manufacturing the TFT.

In one aspect, the present invention provides a method for manufacturing a TFT, including a step of forming a pattern of source/drain electrode, a pattern of doped semiconductor layer, and a pattern of semiconductor layer.

The step of forming the pattern of source/drain electrode, the pattern of doped semiconductor layer, and the pattern of semiconductor layer includes:

forming a semiconductor film, a doped semiconductor film, a source/drain electrode film, and a first patterned photoresist layer sequentially, the first patterned photoresist layer covering a region of the pattern of source/drain electrode and a channel region;

performing first etching so as to remove the source/drain electrode film on a region that is not covered by the first patterned photoresist layer;

performing second etching so as to remove the doped semiconductor film and the semiconductor film on a region that is not covered by the first patterned photoresist layer, thereby forming the pattern of semiconductor layer;

performing ashing treatment on the photoresist layer so as to remove the photoresist layer on the channel region;

hard-baking the photoresist layer after the ashing treatment;

performing third etching so as to remove the source/drain electrode film on a region that is not covered by the photoresist layer after the ashing treatment, thereby forming the pattern of source/drain electrode; and performing fourth etching so as to remove the doped semiconductor film on the region that is not covered by the photoresist layer after the ashing treatment, thereby forming the pattern of doped semiconductor layer.

Further, in the method for manufacturing the TFT, the photoresist layer after the ashing treatment is hard-baked at a temperature of from 50 to 500° C.

Further, in the method for manufacturing the TFT, the photoresist layer after the ashing treatment is hard-baked for 30 to 600 seconds.

Further, in the method for manufacturing the TFT, an etchant used for the first etching has a concentration less than an etchant used for the third etching.

Further, in the method for manufacturing the TFT, the etchant used for the first etching has a concentration of 20% to 40% of the etchant used for the third etching.

Further, in the method for manufacturing the TFT, the etchant used for the first etching has a concentration of 30% of the etchant used for the third etching.

Further, in the method for manufacturing the TFT, the second etching and the fourth etching are both dry etching.

Further, in the method for manufacturing the TFT, the step of forming the first patterned photoresist layer includes:

forming a photoresist film on the formed source/drain electrode film, exposing and developing the photoresist film on different regions by a mask exposure process, and removing the photoresist beyond the region of the pattern of source/drain electrode and the channel region, thereby forming the first patterned photoresist layer.

Further, subsequent to the fourth etching, the method for manufacturing the TFT further includes peeling off the photoresist layer after the asking treatment.

Further, prior to forming the semiconductor film, the method for manufacturing the TFT further includes forming a pattern of gate electrode and a pattern of gate insulating layer.

The step of forming the pattern of gate electrode includes:

forming a gate metal film and a second patterned photoresist layer sequentially, the second patterned photoresist layer covering a region of the pattern of gate electrode;

removing the gate metal film that is not covered by the second patterned photoresist layer by etching, thereby forming the pattern of gate electrode; and peeling off the second patterned photoresist layer.

The step of forming the pattern of gate insulating layer includes:

forming a gate insulating film on the pattern of gate electrode, thereby forming the pattern of gate insulating layer.

In another aspect, the present invention provides a method for manufacturing an array substrate including several TFTs manufactured by the above-mentioned method.

In yet another aspect, the present invention provides a TFT, including a pattern of source/drain electrode, a pattern of doped semiconductor layer, a pattern of semiconductor layer, a pattern of gate electrode and a pattern of gate insulating layer.

The pattern of gate insulating layer is formed on the pattern of gate electrode, the pattern of semiconductor layer is formed on the pattern of gate insulating layer, the pattern of doped semiconductor layer is formed on the pattern of semiconductor layer, and the pattern of source/drain electrode is formed on the pattern of doped semiconductor layer.

The pattern of source/drain electrode, the pattern of doped semiconductor layer, the pattern of doped semiconductor layer and the pattern of semiconductor layer are formed by:

forming a semiconductor film, a doped semiconductor film, a source/drain electrode film, and a first patterned photoresist layer sequentially, the first patterned photoresist layer covering a region of the pattern of source/drain electrode and a channel region;

performing first etching so as to remove the source/drain electrode film on a region that is not covered by the first patterned photoresist layer;

performing second etching so as to remove the doped semiconductor film and the semiconductor film on a region that is not covered by the first patterned photoresist layer, thereby forming the pattern of semiconductor layer;

performing ashing treatment on the photoresist layer so as to remove the photoresist layer on the channel region;

hard-baking the photoresist layer after the ashing treatment;

performing third etching so as to remove the source/drain electrode film on a region that is not covered by the photoresist layer after the ashing treatment, thereby forming the pattern of source/drain electrode; and performing fourth etching so as to remove the doped semiconductor film on the region that is not covered by the photoresist layer after the ashing treatment, thereby forming the pattern of doped semiconductor layer.

Further, in the TFT, a gradient angle between a first side surface and a bottom of the pattern of source/drain electrode is less than 90°, and a gradient angle between a second side surface and the bottom of the pattern of source/drain electrode is less than 90°.

Further, in the TFT, both the gradient angles between the first side surface and the bottom of the pattern of source/drain electrode, and between the second side surface and the bottom of the pattern of source/drain electrode, are in the range of 60 to 70°.

In yet another aspect, the present invention provides an array substrate including a glass substrate, a passivation layer, a pixel electrode and a common electrode, as well as the TFT according to the present invention.

In yet another aspect, the present invention provides a system for manufacturing a TFT. The system is used to machine a to-be-processed workpiece so as to manufacture the TFT.

The system includes a plating device, a photoresist coating device, a wet etching device, a dry etching device, an ashing device, an oven and a mechanical arm.

The plating device is configured to form a semiconductor film, a doped semiconductor film and a source/drain electrode film sequentially on the to-be-processed workpiece.

The photoresist coating device is configured to form a first patterned photoresist layer on the to-be-processed workpiece where the semiconductor film, the doped semiconductor film and the source/drain electrode film have been formed, the first patterned photoresist layer covering a region of a pattern of source/drain electrode and a channel region.

The wet etching device includes a first wet etching unit and a second wet etching unit. The first wet etching unit is configured to perform first etching so as to remove the source/drain electrode film on a region that is not covered by the first patterned photoresist layer, and the second wet etching unit is configured to perform third etching so as to remove the source/drain electrode film on a region that is not covered by the photoresist layer after ashing treatment, thereby forming the pattern of source/drain electrode.

The dry etching device includes a first dry etching unit and a second dry etching unit. The first dry etching unit is configured to perform second etching so as to remove the doped semiconductor film and the semiconductor film on a region that is not covered by the first patterned photoresist layer, thereby to form a pattern of semiconductor layer, and the second dry etching unit is configured to perform fourth etching so as to remove the doped semiconductor film on the region that is not covered by the photoresist layer after the ashing treatment, thereby to form a pattern of doped semiconductor layer.

The ashing device is configured to perform ashing treatment on the photoresist layer so as to remove the photoresist layer on the channel region.

The oven is configured to hard bake the photoresist layer after the ashing treatment.

The mechanical arm is configured to move the to-be-processed workpiece from the wet etching device to the dry etching device, from the dry etching device to the ashing device, from the ashing device to the oven, and from the oven to the wet etching device.

According to the method and system for manufacturing the TFT in the present invention, a processing method including four etching steps is used. As a result, it is able to prevent the undercut between the pattern of semiconductor layer and the pattern of doped semiconductor layer during the manufacturing of the FT, thereby to provide a feasible scheme for further improving the process of manufacturing the TFT.

BRIEF DESCRIPTION OF THE DRAWINGS

In order to illustrate the embodiments of the present invention or the technical solutions in the prior art in a clearer manner, the drawings necessary for the description of the embodiments will be described briefly hereinafter. Obviously, the following drawings merely relate to a part of the embodiments of the present invention, and a person skilled in the art, without any creative effort, may obtain the other drawings based thereon.

DETAILED DESCRIPTION

In order to understand the present invention in a better manner, the present invention is described hereinafter in conjunction with the drawings and the embodiments.

Figure 1:
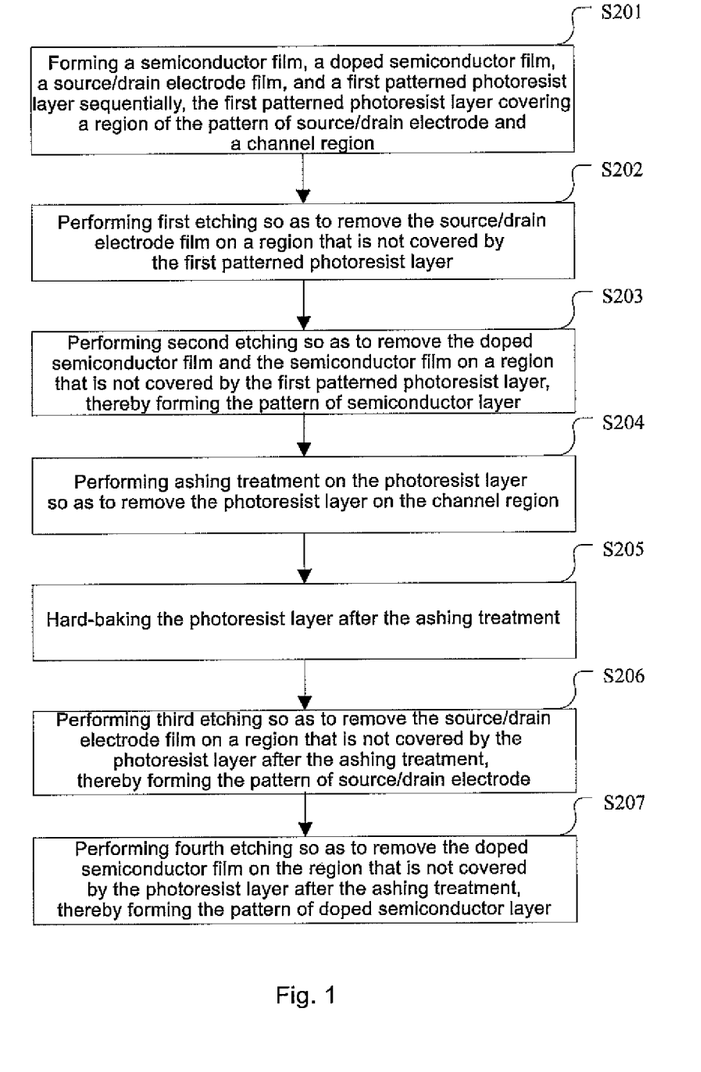
FIG. 1 is a flow chart of forming a pattern of source/drain electrode according to the first embodiment of the present invention.

A method for manufacturing a TFT is provided in the first embodiment of the present invention, including a step of forming a pattern of source/drain electrode, a pattern of doped semiconductor layer, and a pattern of semiconductor layer. As shown in FIG. 1, which is a flow chart of forming the pattern of source/drain electrode according to the first embodiment of the present invention, the step of forming the pattern of source/drain electrode, the pattern of doped semiconductor layer, and the pattern of semiconductor layer includes the following steps S201-207.

Step S201: forming a semiconductor film, a doped semiconductor film, a source/drain electrode film, and a first patterned photoresist layer sequentially, the first patterned photoresist layer covering a region of the pattern of source/drain electrode and a channel region. The channel region refers to a region where a channel of the TFT is formed (i.e., the channel formed between at least a part of a region of a semiconductor and a carrier when the TFT is turned on).

To be specific, as shown in FIG. 2, which is a schematic view showing the procedure of forming patterns of the TFT according to the first embodiment of the present invention, the TFT is formed on a glass substrate 3, the pattern of gate electrode 5 is formed on the glass substrate 3, a pattern of gate insulating layer 4 is formed on the glass substrate 3 and the pattern of gate electrode 5, the semiconductor film 1022' is formed on the pattern of gate insulating layer 4, the doped semiconductor film 1021' is formed on the semiconductor film 1022', and the source/drain electrode film 101' is formed on the doped semiconductor film 1021'. The source/drain electrode film 101' is made of a source/drain metal, and the first patterned photoresist layer 2 is coated on the source/drain electrode film (or a source/drain metal layer) 101'. The first patterned photoresist layer 2 is subjected to mask exposure and development, and its pattern covers the region of the pattern of source/drain electrode and the channel region. In other words, the pattern of the first patterned photoresist layer 2 is identical to the pattern of the semiconductor layer to be formed, and the first patterned photoresist layer 2 has a thickness at the channel region less than at the other portions so as to form a concave portion of the photoresist layer 2 as shown in FIG. 2a.

Step S202: performing first etching so as to remove the source/drain electrode film on a region that is not covered by the first patterned photoresist layer.

Figure 2A:
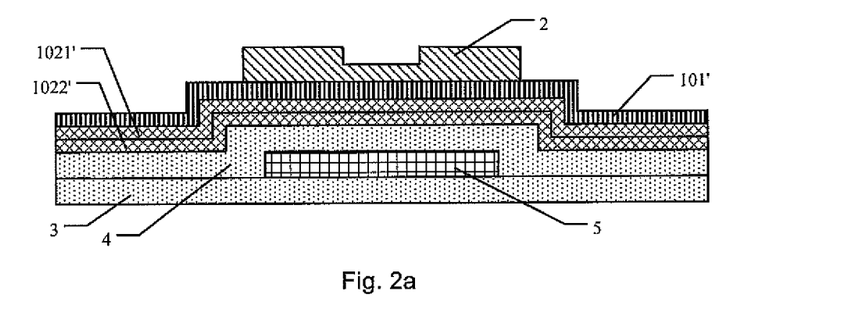
FIG. 2 is a schematic view showing the procedure of forming a pattern of a TFT according to the first embodiment of the present invention.
Figure 2B:
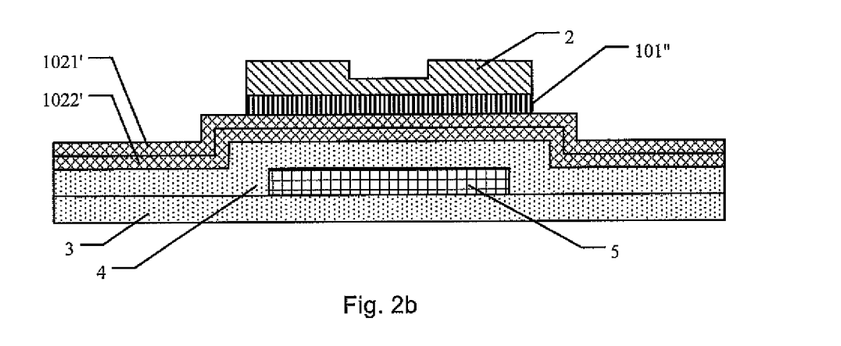

To be specific, as shown in FIG. 2B, a region of the source/drain electrode film 101' that goes beyond the first patterned photoresist layer 2 in FIG. 2a is etched away so as to expose a portion of the doped semiconductor film 1021'. At this time, a pattern of the source/drain electrode film 101' is changed after the first etching, and here it is referred to as partial source/drain electrode film 101".

Step S203: performing second etching so as to remove the doped semiconductor film and the semiconductor film on a region that is not covered by the first patterned photoresist layer, thereby forming the pattern of semiconductor layer.

Figure 2C:
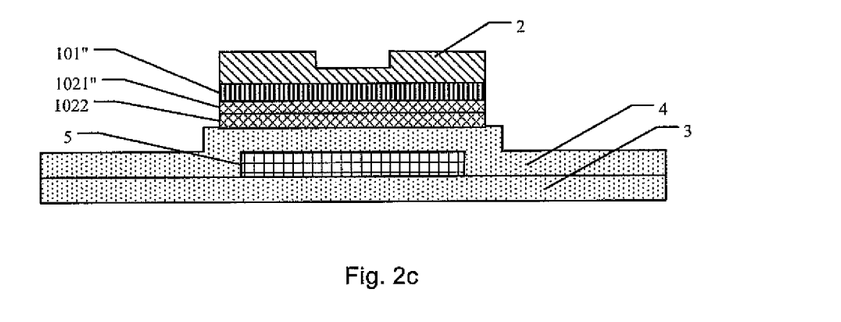

To be specific, as shown in FIG. 2c, a portion of the doped semiconductor film 1021' and a portion of the semiconductor film 1022' are etched away by a dry etching step, so as to form a pattern of semiconductor 1022 having a shape identical to a pattern of the region covered by the first patterned photoresist layer 2. At this time, a pattern of the doped semiconductor film 1021' is changed after the second etching, and here it is referred to as partial doped semiconductor film 1021".

Step S204: performing ashing treatment on the photoresist layer so as to remove the photoresist layer on the channel region.

Figure 2D:
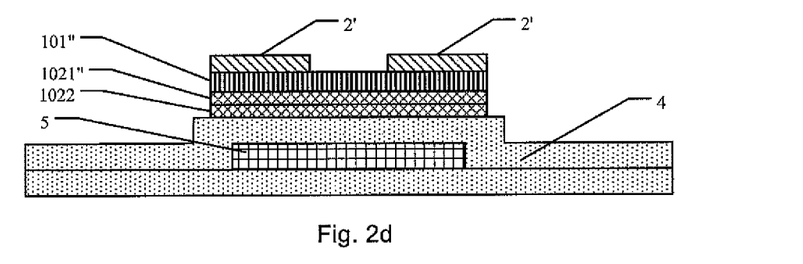

To be specific, the photoresist at the channel region is removed by the ashing treatment, and the photoresist at the region other than the channel region is reserved. At this time, the pattern of the first patterned photoresist layer 2 is changed after the ashing treatment, and here it is referred to as post-ashing photoresist layer 2', as shown in FIG. 2d. In the pattern of the first patterned photoresist layer 2, the photoresist at the channel region is thin, and after the ashing treatment, the entire thickness of the first patterned photoresist layer 2 is reduced. Hence, the photoresist at the channel region is removed so as to expose the source/drain electrode film at the channel region.

Step S205: hard-baking (HB) the photoresist layer after the ashing treatment.

Alternatively, the photoresist is hard-baked using an oven at a temperature of 50 to 500° C. for 30 to 600 seconds. The above temperature and time used for the baking of the photoresist provide a good result, and it is uneasy to cause cracks and deterioration. Furthermore, the temperature and time are not limited thereto, and may be set in accordance with the practical need.

Step S206: performing third etching so as to remove the source/drain electrode film on a region that is not covered by the photoresist layer after the ashing treatment, thereby forming the pattern of source/drain electrode.

Figure 2E:
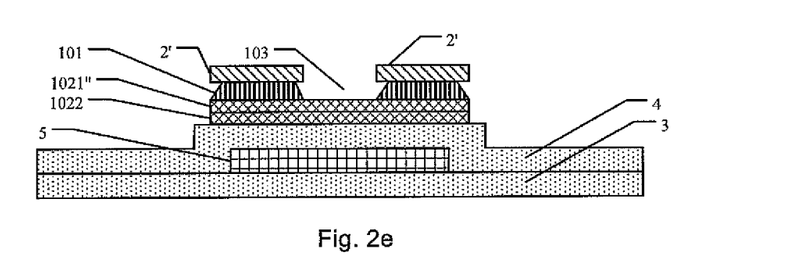

To be specific, the source/drain metal at the channel region is etched away, as shown in FIG. 2e, so as to form the channel region 103. The source/drain metal may include molybdenum, aluminum, and etc.

Step S207: performing fourth etching so as to remove the doped semiconductor film on the region that is not covered by the photoresist layer 2' after the ashing treatment, thereby forming the pattern of doped semiconductor layer 1021.

Figure 2F:
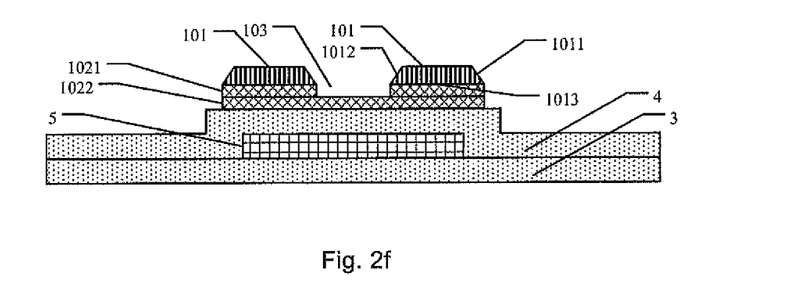

To be specific, as shown in FIG. 2f, a portion of the pattern of partial doped semiconductor layer 1021" at the channel region 103 is etched away so as to form the pattern of doped semiconductor layer 1021.

Usually, the photoresist includes positive photoresist and negative photoresist. If the positive photoresist is used, the photoresist that may be exposed is removed so as to form the patterned photoresist layer. If the negative photoresist is used, the photoresist that may be exposed is reserved and the photoresist that may not be exposed is removed, so as to form the patterned photoresist layer. The type of the photoresist is not limited in the present invention, and may be selected in accordance with the practical need.

Further, in the method for manufacturing the TFT, the photoresist layer after the ashing treatment is hard-baked at a temperature of 50 to 500° C.

Further, in the method for manufacturing the TFT, the photoresist layer after the ashing treatment is hard-baked for 30 to 600 seconds.

Further, in the method for manufacturing the TFT, the etchant used for the first etching has a concentration less than that used for the third etching. The concentration is not limited in this embodiment, and may be selected in accordance with the practical need, as long as the etching can be performed normally.

Further, in the method for manufacturing the TFT, the etchant used for the first etching in this embodiment has a concentration of 20% to 40% of that used for the third etching. Such a concentration provides an excellent etching effect. Alternatively, the etchant used for the first etching has a concentration of 30% of that used for the third etching.

The etchant used for the first etching is an etching concentrate, and the etchant used for the third etching is the etching concentrate diluted with water. The etching concentrate includes at least one of acetic acid and nitric acid.

Further, in the method for manufacturing the TFT, the second etching and the fourth etching are both dry etching. Of source, this is merely a preferred one, and the other etching method may be selected in accordance with the practical need, as long as the etching can be performed.

Further, in the method for manufacturing the TFT, the step of forming the first patterned photoresist layer includes:

forming a photoresist film on the formed source/drain electrode film, exposing and developing the photoresist film on different regions by a mask exposure process, and removing the photoresist beyond the region of the pattern of source/drain electrode and the channel region, thereby forming the first patterned photoresist layer.

Further, subsequent to the fourth etching, the method for manufacturing the TFT further includes removing the photoresist layer after the ashing treatment. As shown in FIG. 2f, the photoresist on the pattern of source/drain electrode is completely ashed and removed.

Further, prior to forming the semiconductor film, the method for manufacturing the TFT further includes forming the pattern of gate electrode and the pattern of gate insulating layer.

The step of forming the pattern of gate electrode includes:

forming a gate metal film and a second patterned photoresist layer sequentially, the second patterned photoresist layer covering a region of the pattern of gate electrode of the TFT;

removing the gate metal film that is not covered by the second patterned photoresist layer by etching, thereby forming the pattern of gate electrode; and removing the second patterned photoresist layer.

The step of forming the pattern of gate insulating layer includes:

forming a gate insulating film on the pattern of gate electrode, thereby forming the pattern of gate insulating layer.

For the TFT manufactured by four etching steps, there is no undercut between the pattern of semiconductor layer and the pattern of doped semiconductor layer.

The resultant TFT, as shown in FIG. 2f, includes: the pattern of gate electrode 5, the pattern of gate insulating layer 4, the pattern of doped semiconductor layer 1021, the pattern of semiconductor layer 1022, the pattern of source/drain electrode 101, and the hollow channel region 103. The pattern of semiconductor layer 1022 is made of a-Si, and the pattern of doped semiconductor layer 1021 is made of n+-doped a-Si. A gradient angle between a side surface of the pattern of source/drain electrode 101 and a bottom thereof is less than 90°.

The gradient angle of less than 90° between the side surface of the pattern of source/drain electrode 101 and the bottom thereof is obtained on the basis of the following principle. After the first etching, because the diluted etching concentrate is used, the resultant gradient angle between the side surface of the pattern of source/drain electrode 101 and the bottom thereof is approximately 90°. After the third etching, because the etching concentrate is used, the resultant gradient angle between the side surface of the pattern of source/drain electrode 101 and the bottom thereof may be less than 90°.

Hence, the technical solution of this embodiment may further prevent a low yield due to the gradient angle. To be specific, in a traditional etching procedure, after the pattern of source/drain electrode is formed, the gradient angle between the side surface of the pattern of source/drain electrode 101 and a surface thereunder is approximately 90°. Due to such a gradient angle, a transparent conductive film (ITO film) will be easily broken at a corner when the ITO film is formed subsequently. However, in the technical solution of this embodiment, it is able to reduce the gradient angle, i.e., to provide a gentle slope. As a result, it is able to prevent the breakage when the ITO film is formed by depositing, thereby to improve the yield.

In addition, when the TFT is subjected to the photolithographic process including two wet etching steps and two dry etching steps, if the photoresist is not hard-baked, the etching concentrate used for the second wet etching step causes the photoresist, which is not hard-baked, to be cracked. For example, after the asking treatment, if the photoresist at the region of the pattern of source/drain electrode is not hard-baked, cracks is easily generated when the second wet etching step is performed. In addition, the hard-baking step performed immediately after the entire photolithographic process is ended may cause the photoresist to be deformed, and it is difficult to perform the ashing treatment. Hence, the hard-baking step is added between the first dry etching step and the second wet etching step so as to effectively prevent the cracks of the photoresist.

The experiment results show that an optimal effect is achieved when the photoresist is hard-baked at a temperature of 50 to 500° C. for 30 to 600 seconds. When the hard-baking step is performed at this temperature or for this period of time, or both, the TFT with the best quality will be manufactured, and there will be the lowest risk to cause undercuts between the pattern of semiconductor layer and the pattern of doped semiconductor layer, as well as the cracks of the photoresist. In addition, the gradient angle between the side surface of the pattern of source/drain electrode and the bottom thereof is preferably from 60 to 70°.

The second embodiment of the present invention provides a method for manufacturing an array substrate including several TFTs manufactured by the above-mentioned method.

Figure 3:
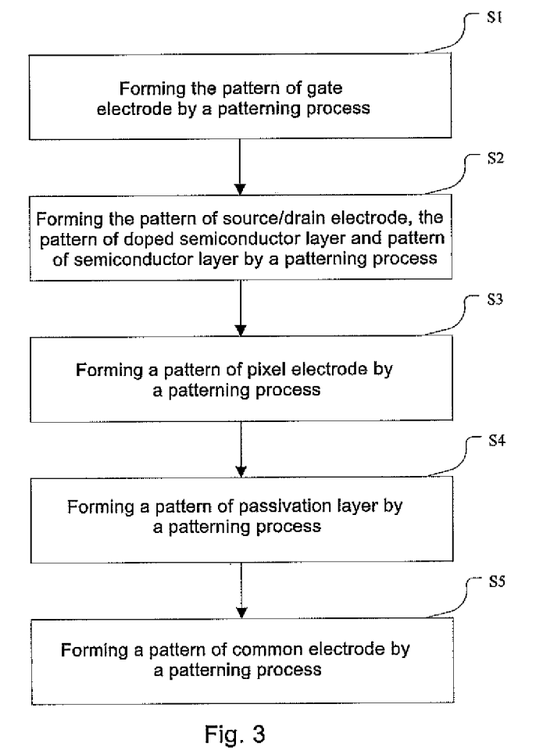
FIG. 3 is a flow chart of a method for manufacturing an array substrate according to the second embodiment of the present invention.

FIG. 3 is a flow chart of the method for manufacturing the array substrate according to the second embodiment of the present invention, and FIG. 4 is a schematic view showing the procedure of forming the array substrate according to the second embodiment of the present invention. As shown in FIG. 3, the method for manufacturing the array substrate includes the following steps S1-S5.

Figure 4A:
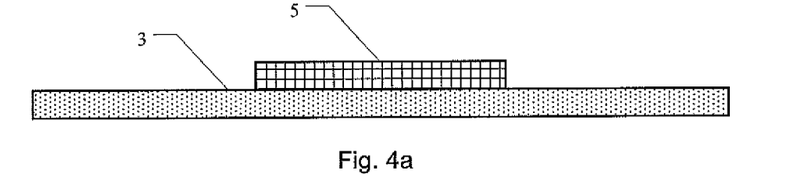
FIG. 4 is a schematic view showing the procedure of forming a pattern of an array substrate according to the second embodiment of the present invention.
Figure 4B:
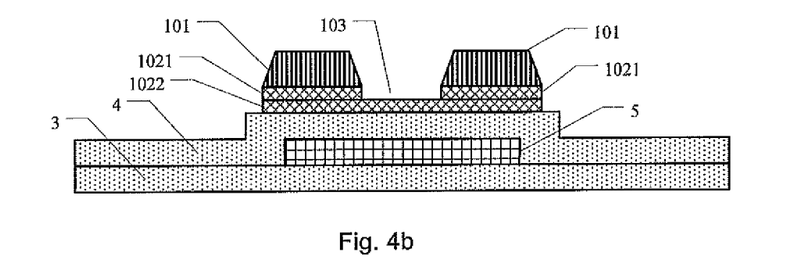

Step S1: forming the pattern of gate electrode by a patterning process. As shown in FIG. 4a, the pattern of gate electrode 5 is formed on the glass substrate 3.

Step S2: forming the pattern of source/drain electrode, the pattern of doped semiconductor layer and pattern of semiconductor layer by a patterning process. As shown FIG. 4b, the pattern of gate insulating layer 4 is formed on the glass substrate 3 and the pattern of gate electrode 5, the pattern of semiconductor layer 1022 is formed on the pattern of gate insulating layer 4, the pattern of doped semiconductor layer 1021 is formed on the pattern of semiconductor layer 1022, the pattern of source/drain electrode 101 is formed on the pattern of doped semiconductor layer 1022, and the channel region 103 is formed in the pattern of source/drain electrode 101 and the pattern of doped semiconductor layer 1021.

Figure 4C:
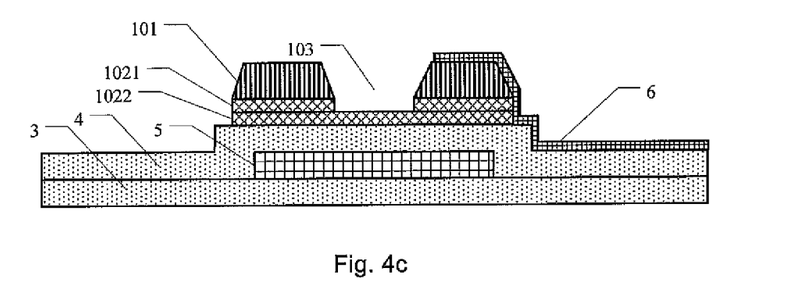

Step S3: forming a pattern of pixel electrode by a patterning process. As shown in FIG. 4c, the pattern of pixel electrode 6 covers the pattern of gate insulating layer 4.

Figure 4D:
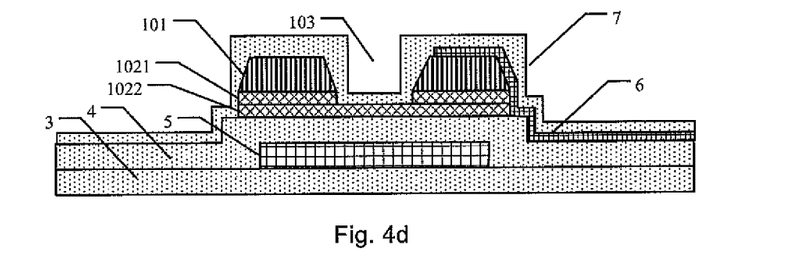

Step S4: forming a pattern of passivation layer by a patterning process. As shown in FIG. 4d, the pattern of passivation layer 7 covers the TFT.

Figure 4E:
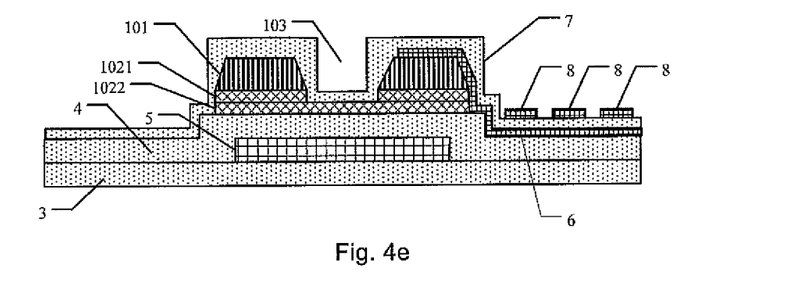

Step S5: forming a pattern of common electrode by a patterning process. As shown in FIG. 4e, the pattern of common electrode 8 is formed on the pattern of passivation layer 7.

Through two wet etching steps and two dry etching steps, the pattern of pixel electrode 6, after being plated, will not be broken. The second wet etching step is performed on the pattern of source/drain electrode using the etching concentrate, and this etching concentrate causes the gradient angle between the side surface of the pattern of source/drain electrode 101 and the bottom thereof less than 90°. As a result, it is able to prevent the pattern of pixel electrode 6 from being broken at a side region of the pattern of source/drain electrode when the pattern of pixel electrode 6 is plated. If the diluted etchant is merely used to perform the wet etching step, the gradient angle between the side surface of the source/drain electrode 101 and the bottom thereof is approximately 90°, and it is easy to cause cracks at the side region of the pattern of source/drain electrode when the pattern of pixel electrode 6 is plated.

In addition, in the method for manufacturing the array substrate according to the second embodiment of the present invention, the array substrate includes the TFT, and there is no undercut between the pattern of semiconductor layer and the pattern of doped semiconductor layer. Further, the photoresist is not cracked during the manufacturing.

The third embodiment of the present invention provides a TFT, including the pattern of source/drain electrode, the pattern of doped semiconductor layer, the pattern of semiconductor layer, the pattern of gate electrode and the pattern of gate insulating layer.

The pattern of gate insulating layer is formed on the pattern of gate electrode, the pattern of semiconductor layer is formed on the pattern of gate insulating layer, the pattern of doped semiconductor layer is formed on the pattern of semiconductor layer, and the pattern of source/drain electrode is formed on the pattern of doped semiconductor layer.

The pattern of source/drain electrode, the pattern of doped semiconductor layer and the pattern of semiconductor layer are formed by:

forming a semiconductor film, a doped semiconductor film, a source/drain electrode film, and a first patterned photoresist layer subsequently, the first patterned photoresist layer covering a region of the pattern of source/drain electrode and a channel region;

performing first etching so as to remove the source/drain electrode film on a region that is not covered by the first patterned photoresist layer;

performing second etching so as to remove the doped semiconductor film and the semiconductor film on a region that is not covered by the first patterned photoresist layer, thereby forming the pattern of semiconductor layer;

performing ashing treatment on the photoresist layer so as to remove the photoresist layer on the channel region;

hard-baking the photoresist layer after the ashing treatment;

performing third etching so as to remove the source/drain electrode film on a region that is not covered by the photoresist layer after the ashing treatment, thereby forming the pattern of source/drain electrode; and performing fourth etching so as to remove the doped semiconductor film on the region that is not covered by the photoresist layer after the ashing treatment, thereby forming the pattern of doped semiconductor layer.

The hollow channel region is provided in the pattern of source/drain electrode and the pattern of doped semiconductor layer.

Further, in the TFT, a gradient angle between a first side surface and a bottom of the pattern of source/drain electrode is less than 90°, and a gradient angle between a second side surface and the bottom of the pattern of source/drain electrode is less than 90°.

As shown in FIG. 2f, the gradient angle between a first side surface 1011 of the pattern of source/drain electrode and the bottom 1013 of the pattern of source/drain electrode is less than 90°, and the gradient angle between a second side surface 1012 of the pattern of source/drain electrode and the bottom 1013 of the pattern of source/drain electrode is less than 90°.

In the TFT according to the third embodiment of the present invention, there is no undercut between the pattern of semiconductor layer and the pattern of doped semiconductor layer, and the photoresist will not be cracked during the manufacturing.

The fourth embodiment of the present invention provides an array substrate including a glass substrate, a pattern of passivation layer, a pattern of pixel electrode, a pattern of common electrode, and the TFT as mentioned above.

The TFT includes the pattern of gate electrode 5, the pattern of gate insulating layer 4, the pattern of doped semiconductor layer 1021, the pattern of semiconductor layer 1022, the pattern of source/drain electrode 101 and the hollow channel region 103. The gradient angle between the side surface of the pattern of source/drain electrode 101 and the bottom of the pattern of source/drain electrode 101 is less than 90°.

In the array substrate according to the fourth embodiment of the present invention, there is no undercut between the pattern of semiconductor layer and the pattern of doped semiconductor layer, and the photoresist will not be cracked during the manufacturing. In addition, the pattern of pixel electrode will not be broken at the side region of the pattern of source/drain electrode.

The fifth embodiment of the present invention provides a system for manufacturing a TFT. The system is used to machine a to-be-processed workpiece so as to manufacture the TFT.

Figure 5:
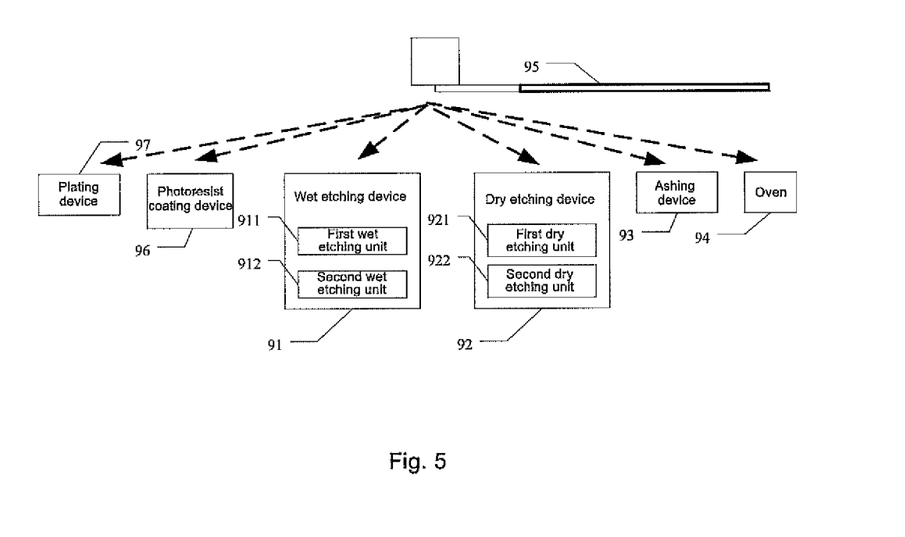
FIG. 5 is a schematic view showing a system for manufacturing a TFT according to the fifth embodiment of the present invention.

The system includes a plating device 97, a photoresist coating device 96, a wet etching device 91, a dry etching device 92, an ashing device 93, an oven 94 and a mechanical arm 95.

The plating device 97 is configured to form the semiconductor film, the doped semiconductor film and the source/drain electrode film sequentially on the to-be-processed workpiece.

The photoresist coating device 96 is configured to form the first patterned photoresist layer on the to-be-processed workpiece where the semiconductor film, the doped semiconductor film and the source/drain electrode film have been formed, the first patterned photoresist layer covering a region of the pattern of source/drain electrode and the channel region.

The wet etching device 91 includes a first wet etching unit 911 and a second wet etching unit 912. The first wet etching unit 911 is configured to perform first etching so as to remove the source/drain electrode film on a region that is not covered by the first patterned photoresist layer, and the second wet etching unit 912 is configured to perform third etching so as to remove the source/drain electrode film on a region that is not covered by the photoresist layer after ashing treatment, thereby to form the pattern of source/drain electrode.

The dry etching device 92 includes a first dry etching unit 921 and a second dry etching unit 922. The first dry etching unit 921 is configured to perform second etching so as to remove the doped semiconductor film and the semiconductor film on a region that is not covered by the first patterned photoresist layer, thereby to form a pattern of semiconductor layer, and the second dry etching unit 922 is configured to perform fourth etching so as to remove the doped semiconductor film on the region that is not covered by the photoresist layer after the ashing treatment, thereby to form a pattern of doped semiconductor layer.

The ashing device 93 is configured to perform ashing treatment on the photoresist layer so as to remove the photoresist layer on the channel region.

The oven 94 is configured to hard bake the photoresist layer after the ashing treatment.

The mechanical arm 95 is configured to move the to-be-processed workpiece from the wet etching device to the dry etching device, from the dry etching device to the ashing device, from the ashing device to the oven, and from the oven to the wet etching device.

The system according to the fifth embodiment of the present invention is used to implement the method for manufacturing the TFT according to the first embodiment of the present invention, and its working principle is the same as that mentioned in the first embodiment, which will not be repeated herein.

The above are merely the preferred embodiments of the present invention, and the present invention is not limited thereto. Obviously, a person skilled in the art may make further modifications and alterations without departing from the spirit and essence of the present invention, and these modifications and alternations shall also fall within the scope defined by the attached claims.

What is claimed is:

1. A method for manufacturing a TFT, comprising a step of forming a pattern of source/drain electrode, a pattern of doped semiconductor layer, and a pattern of semiconductor layer, wherein
    the step of forming the pattern of source/drain electrode, the pattern of doped semiconductor layer, and the pattern of semiconductor layer comprises:
    forming a semiconductor film, a doped semiconductor film, a source/drain electrode film, and a first patterned photoresist layer sequentially, the first patterned photoresist layer covering a region of the pattern of source/drain electrode and a channel region;
    performing first etching so as to remove the source/drain electrode film on a region that is not covered by the first patterned photoresist layer;
    performing second etching so as to remove the doped semiconductor film and the semiconductor film on a region that is not covered by the first patterned photoresist layer, thereby forming the pattern of semiconductor layer;
    performing ashing treatment on the photoresist layer so as to remove the photoresist layer on the channel region;
    hard-baking the photoresist layer after the ashing treatment;
    performing third etching so as to remove the source/drain electrode film on a region that is not covered by the photoresist layer after the ashing treatment, thereby forming the pattern of source/drain electrode; and
    performing fourth etching so as to remove the doped semiconductor film on the region that is not covered by the photoresist layer after the ashing treatment, thereby forming the pattern of doped semiconductor layer.

2. The method according to claim 1, wherein the photoresist layer after the ashing treatment is hard-baked at a temperature of from 50 to 500° C.

3. The method according to claim 1, wherein the photoresist layer after the ashing treatment is hard-baked for 30 to 600 seconds.

4. The method according to claim 1, wherein an etchant used for the first etching has a concentration less than an etchant used for the third etching.

5. The method according to claim 4, wherein the etchant used for the first etching has a concentration of 20% to 40% of the etchant used for the third etching.

6. The method according to claim 5, wherein the etchant used for the first etching has a concentration of 30% of the etchant used for the third etching.

7. The method according to claim 1, wherein the second etching and the fourth etching are both dry etching.

8. The method according to claim 1, wherein the step of forming the first patterned photoresist layer comprises:
    forming a photoresist film on the formed source/drain electrode film, exposing and developing the photoresist film on different regions by a mask exposure process, and removing the photoresist beyond the region of the pattern of source/drain electrode and the channel region, thereby forming the first patterned photoresist layer.

9. The method according to claim 1, wherein subsequent to the fourth etching, the method further comprises peeling off the photoresist layer after the ashing treatment.

10. The method according to claim 1, wherein prior to forming the semiconductor film, the method further comprises forming a pattern of gate electrode and a pattern of gate insulating layer,
    the step of forming the pattern of gate electrode comprises:
    forming a gate metal film and a second patterned photoresist layer sequentially, the second patterned photoresist layer covering a region of the pattern of gate electrode;
    removing the gate metal film that is not covered by the second patterned photoresist layer by etching, thereby forming the pattern of gate electrode; and
    peeling off the second patterned photoresist layer, and
    the step of forming the pattern of gate insulating layer comprises:
    forming a gate insulating film on the pattern of gate electrode, thereby forming the pattern of gate insulating layer.

* * * * *